(12) United States Patent
Tomoatsu et al.

(10) Patent No.: US 12,609,056 B2
(45) Date of Patent: Apr. 21, 2026

(54) FLEXIBLE DISPLAY AND A METHOD FOR MANUFACTURING FLEXIBLE DISPLAY

(71) Applicant: Huawei Technologies Co., Ltd., Shenzhen (CN)

(72) Inventors: Kinoshita Tomoatsu, Yokohama (JP); Kenichi Takatori, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 338 days.

(21) Appl. No.: 18/363,281

(22) Filed: Aug. 1, 2023

(65) Prior Publication Data

US 2023/0380255 A1     Nov. 23, 2023

Related U.S. Application Data

(63) Continuation of application No. PCT/CN2021/074820, filed on Feb. 2, 2021.

(51) Int. Cl.
| | |
|---|---|
| *G09F 9/30* | (2006.01) |
| *H10K 59/80* | (2023.01) |
| *H10K 71/13* | (2023.01) |
| *H10K 77/10* | (2023.01) |
| *H10K 102/00* | (2023.01) |

(52) U.S. Cl.
CPC ........... *G09F 9/301* (2013.01); *H10K 59/879* (2023.02); *H10K 71/135* (2023.02); *H10K 77/111* (2023.02); *H10K 2102/311* (2023.02)

(58) Field of Classification Search
CPC .... G09F 9/301; H10K 59/879; H10K 71/135; H10K 77/111; H10K 2102/311; Y02E 10/549
See application file for complete search history.

(56) References Cited

U.S. PATENT DOCUMENTS

| | | | | |
|---|---|---|---|---|
| 2014/0295150 A1* | 10/2014 | Bower | ................... | B32B 25/20 |
| | | | | 428/411.1 |
| 2016/0255713 A1 | 9/2016 | Kim et al. | | |
| 2018/0134922 A1* | 5/2018 | Katami | ............ | G02F 1/133502 |
| 2018/0370186 A1* | 12/2018 | Everaerts | ................. | B32B 3/18 |
| 2019/0286266 A1* | 9/2019 | Bu | ....................... | H10K 77/111 |
| 2022/0113824 A1* | 4/2022 | Kishimoto | ........... | H10K 77/111 |

(Continued)

FOREIGN PATENT DOCUMENTS

| | | |
|---|---|---|
| CN | 106228910 A | 12/2016 |
| CN | 108430763 A | 8/2018 |

(Continued)

OTHER PUBLICATIONS

Masumi Nishimura et al, A 5.5-inch full HD foldable AMOLED display based on neutral-plane splitting concept, Society for Information Display, vol. 27, Issue 8, Jun. 12, 2019, pp. 480-486.

*Primary Examiner* — J.E. Schoenholtz

(74) *Attorney, Agent, or Firm* — Conley Rose, P.C.

(57) ABSTRACT

A flexible display includes a display layer having a plurality of light emitting elements for displaying an image; a first layer disposed on a first surface of the display layer; a second layer disposed on a second surface of the display layer; and an adhesive layer disposed between the display layer and the first layer and/or between the display layer and the second layer. The adhesive layer comprises elements separated in the in-plane direction.

20 Claims, 18 Drawing Sheets

(56)                    References Cited

U.S. PATENT DOCUMENTS

| | | | | |
|---|---|---|---|---|
| 2022/0140283 | A1* | 5/2022 | Kim ..................... | H10K 59/38 257/40 |
| 2023/0092986 | A1* | 3/2023 | Rieutort-Louis .... | H10K 59/122 257/40 |

FOREIGN PATENT DOCUMENTS

| | | | |
|---|---|---|---|
| CN | 110707229 A | 1/2020 |
| CN | 111445796 A | 7/2020 |

* cited by examiner (A)

UV    or    Heating (B)

(A)

(B)

(A)

(B)

FLEXIBLE DISPLAY AND A METHOD FOR MANUFACTURING FLEXIBLE DISPLAY

CROSS-REFERENCE TO RELATED APPLICATIONS

This is a continuation of International Patent Application No. PCT/CN2021/074820 filed on Feb. 2, 2021, the disclosure of which is hereby incorporated by reference in its entirety.

TECHNICAL FIELD

The present disclosure relates to a display device, and more particularly to a flexible display such as a foldable display and a rollable display, and a method for manufacturing a flexible display.

BACKGROUND

As flat panels become thinner and lighter, foldable displays have been put into practical use. On the other hand, a technology of portable electronic paper is also advancing. Under these circumstances, development of flexible displays is accelerating.

The flexible displays have been developed by many organizations, and in particular, foldable displays have been commercialized by smartphone manufacturers. The foldable display has an advantage that it can be folded and made smaller when not in use by a user. In recent years, the concept of flexible display has been promoted. It is expected that a rollable display that can be rolled up and stored will be put into practical use.

The flexible display is subject to mechanical stress when it is bent. The smaller the bending radius of the flexible display, the more compact the flexible display becomes. Although the flexible display having the smaller radius is convenient for the user from the viewpoint of portability, the mechanical stress increases. As the mechanical stress increases, the flexible display may deteriorate and be destroyed. Therefore, it is important to reduce the mechanical stress applied to the flexible display when it is bent or rolled.

SUMMARY

It is an object of the present disclosure to provide a flexible display which can reduce mechanical stress in a display module, and a method for manufacturing the flexible display.

In the present disclosure, a patterned adhesive layer is applied to a display module. Also, when using a patterned adhesive layer over the light emitting pixels, a refractive index matching agent is filled between the adhesive layers.

According to the first aspect, there is provided a flexible display, comprising a display layer having a plurality of light emitting elements for displaying an image; a first layer provided on a first surface of the display layer; a second layer provided on a second surface of the display layer; and an adhesive layer provided between the display layer and the first layer and/or between the display layer and the second layer, wherein the adhesive layer has elements separated in an in-plane direction.

According to this aspect, the adhesive layer has elements separated in an in-plane direction. Therefore, mechanical stress in the display module can be reduced. As a result, the winding radius of the rollable display can be reduced and the portability can be increased.

With respect to a possible implementation of the first aspect, when the adhesive layer is provided in a light emitting direction of the plurality of light emitting elements, each of the separated elements covers at least one display element.

According to this implementation, it is possible to prevent a user from recognizing the pressure sensitive adhesive (PSA) pattern in the flexible display.

With respect to a possible implementation of the first aspect, the first surface includes a substrate, the substrate has elements separated in an in-plane direction, and the adhesive layer is separated corresponding to the separated elements of the substrate.

According to this implementation, if the supporting substrate cannot be bent as it is, the mechanical stress in the display module can be reduced by separating the supporting substrate.

With respect to a possible implementation of the first aspect, the adhesive layer is separated such as to be discontinuous in a bending direction of the display device.

According to this implementation, the mechanical stress when the flexible display is bent or wound in the direction is relieved.

With respect to a possible implementation of the first aspect, the adhesive layer is provided with a refractive index matching agent in a gap between adjacent separated elements.

According to this implementation, reflection of light at the interface between air and the adhesive layer is prevented. In this way, it is possible to suppress deterioration of the quality of the displayed image.

With respect to a possible implementation of the first aspect, an elastic modulus of a refractive index matching agent is smaller than the elastic modulus of an adhesive of the adhesive layer.

According this implementation, it is possible to suppress deterioration of the quality of the displayed image while reducing the mechanical stress in the display module.

With respect to a possible implementation of the first aspect, the second layer includes a polarizer, and the adhesive layer is provided between the display layer and the polarizer.

According to this implementation, the separated adhesive layer will be invisible because the polarizer absorbs the reflected light even if it is reflected by outside light.

According to the second aspect, there is provided a method for manufacturing flexible displays, comprising forming a first adhesive layer on a first layer; forming a display layer having a plurality of light emitting elements for displaying an image on the first adhesive layer; forming a second adhesive layer on the display layer; and forming a second layer on the second adhesive layer, wherein the first adhesive layer and/or the second adhesive layer has elements separated in an in-plane direction.

With respect to a possible implementation of the second aspect, when the adhesive layer is formed in a light emitting direction of the plurality of light emitting elements, the forming the second adhesive layer separates the second adhesive layer such that each of the separated elements covers at least one display element.

With respect to a possible implementation of the second aspect, the first layer comprises a substrate, the substrate is formed to have separated elements in an in-plane direction, and the number of the separated elements of the adhesive layer corresponds to the separated elements of the substrate.

With respect to a possible implementation of the second aspect, the first adhesive layer and/or the second adhesive layer is separated such as to be discontinuous in a bending direction of the display device.

With respect to a possible implementation of the second aspect, the forming the first adhesive layer and/or the step of forming the second adhesive layer includes providing a refractive index matching agent in a gap between adjacent separated elements.

With respect to a possible implementation of the second aspect, an elastic modulus of the refractive index matching agent is smaller than the elastic modulus of an adhesive of the first adhesive layer and/or the second adhesive layer.

With respect to a possible implementation of the second aspect, the providing the refractive index matching agent is performed by screen printing or inkjet printing.

According to this implementation, it is possible to facilitate application of the refractive index matching agent by screen printing or inkjet printing.

With respect to a possible implementation of the second aspect, the providing the refractive index matching agent comprises forming a dam surrounding the first adhesive layer and/or the second adhesive layer; and filling the inside of the dam with the refractive index matching agent.

According to this implementation, it is possible to suppress deterioration of the quality of the displayed image by an impregnation technique such as a vacuum-pressure impregnation method.

With respect to a possible implementation of the second aspect, the second layer includes a polarizer.

According to this implementation, the adhesive layer is provided between the display layer and the polarizer. Therefore, the separated adhesive layer will be invisible because the polarizer absorbs the reflected light even if it is reflected by outside light.

With respect to a possible implementation of the second aspect, the forming the first adhesive layer and/or the forming the second adhesive layer comprises: forming an adhesive layer by screen printing or inkjet printing.

According to this implementation, it is possible to facilitate lamination of the adhesive layer by screen printing or inkjet printing.

With respect to a possible implementation of the second aspect, the forming the first adhesive layer and/or the forming the second adhesive layer comprises forming an adhesive precursor by screen printing or inkjet printing; and irradiating the adhesive precursor with UV or heating the precursor.

According to this implementation, the mechanical stress in the display module can be reduced by using the adhesive precursor. This method is effective when the viscosity of the precursor is low and the printing process can be used.

With respect to a possible implementation of the second aspect, the forming the first adhesive layer and/or the forming the second adhesive layer comprises forming an adhesive layer which is continuous in the in-plane direction on the display layer; and separating the adhesive layer into the elements.

According to this implementation, it is possible to form the adhesive layer which has elements separated in an in-plane direction from the continuous adhesive layer.

With respect to a possible implementation of the second aspect, the forming the first adhesive layer comprises forming a pattern of the adhesive layer on a temporary substrate; and transferring the pattern of the adhesive layer onto the first layer.

According to this implementation, it is possible to form the adhesive layer by using a transfer technique.

With respect to a possible implementation of the second aspect, the forming the second adhesive layer comprises forming a pattern of the adhesive layer on a temporary substrate; and transferring the pattern of the adhesive layer onto the display layer.

According to this implementation, it is possible to form the adhesive layer by using a transfer technique.

With respect to a possible implementation of the second aspect, the forming the second adhesive layer comprises laminating a photosensitive water-repellent material on the display layer; laminating a mask on the photosensitive water-repellent material to form a mask pattern; changing the photosensitive water-repellent material into a hydrophilic substance by irradiating the photosensitive water-repellent material with UV or heating the photosensitive water-repellent material; and forming the adhesive layer on the hydrophilic substance.

According to this implementation, it is possible to form the adhesive layer on the photosensitive water-repellent material.

BRIEF DESCRIPTION OF DRAWINGS

To describe the technical solutions in the embodiments more clearly, the following briefly describes the accompanying drawings required for describing the present embodiments. Apparently, the accompanying drawings in the following description depict merely some of the possible embodiments, and a person of ordinary skill in the art may still derive other drawings, without creative efforts, from these accompanying drawings, in which.

DESCRIPTION OF EMBODIMENTS

Figure 1:
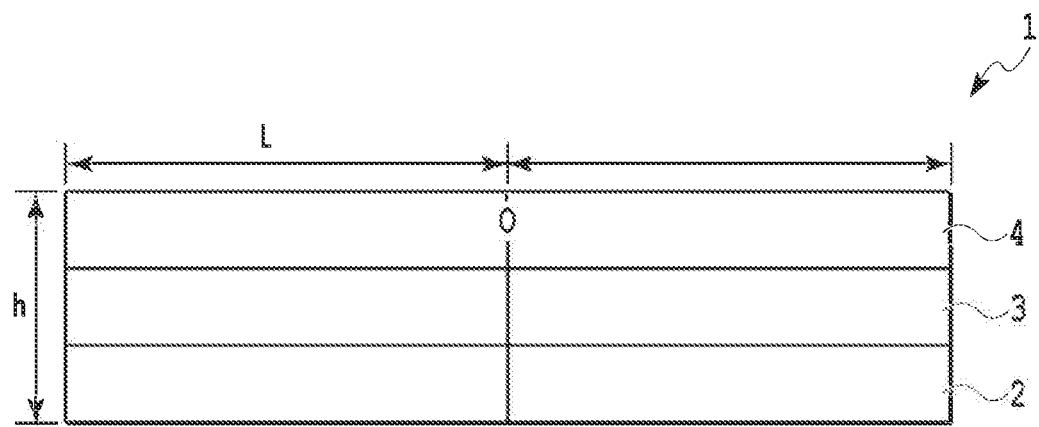
FIG. 1 is a diagram for explaining mechanical stress applied to a flexible display.

To make persons skilled in the art understand the technical solutions in the present disclosure better, the following clearly and completely describes technical solutions in embodiments of the present disclosure with reference to the accompanying drawings. Apparently, the described embodiments are merely a part rather than all of embodiments of the present disclosure. All other embodiments obtained by persons of ordinary skill in the art based on the embodiments of the present disclosure without creative efforts shall fall within the protection scope of the present disclosure.

Terms used in the embodiments of this application are merely used to explain specific embodiments of this application, but are not intended to limit this application. In the following description, similar reference numerals indicate similar elements.

First Embodiment

First, the mechanical stress applied to a flexible display will be described with reference to FIG. 1. FIG. 1 is a cross-sectional view of a portion of the flexible display. A layer structure 1 includes the first layer 2 including a substrate, the second layer 3 which is an adhesive layer, and the third layer 4 including a back film from the lower side of the drawing. In this structure, consider the case where a flexible material is used for the adhesive layer to relieve stress. The center of the upper surface of the layer structure 1 (i.e., ½ of the width of the flexible display 1) is defined as the origin O, a distance from the center to the position in the horizontal direction is L, and the height is h. A coefficient $\rho$ proportional to an elongation rate of the flexible display 1 is represented by $\rho=L/h$. From this equation, it can be seen that the larger L is, the larger $\rho$ becomes. Focusing on the second layer 3 which is the adhesive layer, the closer to the origin O, the smaller $\rho$ becomes, and the more difficult it is to relieve mechanical stress. On the other hand, the larger L is, the larger $\rho$ becomes, and the easier it is to relax the mechanical stress.

As described above, the mechanical stress varies depending on the horizontal position, and a strong mechanical stress may be applied at a specific position. Therefore, it is desirable to configure the flexible display such that it has an ability to uniformly relieve stress in the horizontal direction.

Figure 2:
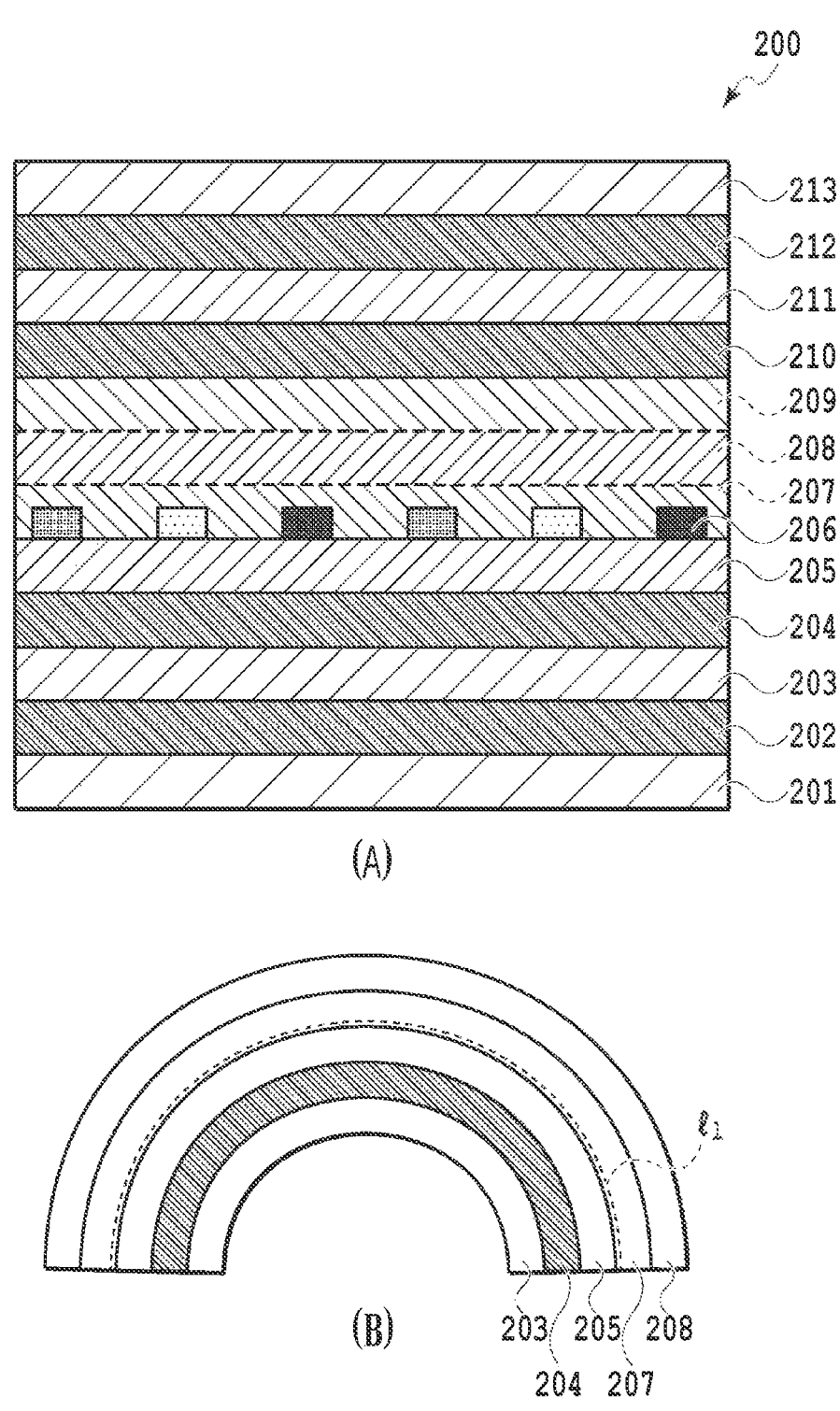
FIG. 2 is a diagram showing a cross-sectional structure of a portion of a flexible display according to a comparative example of the present embodiment.

FIG. 2 is a diagram showing a cross-sectional structure of a portion of a flexible display according to a comparative example of the present embodiment. In the structure shown in FIG. 2(A), a PSA 202, a back film (BF) 203, and a PSA 204 are sequentially laminated on a substrate 201. Further, on the PSA 204, a composite layer (a thin-film transistor (TFT)/polyimide (PI)) 205 composed of two layers of a PI substrate and a TFT formed on the polyimide substrate, a light emitting layer 207 including an organic electroluminescence (EL) element 206, and a Thin Film Encapsulation (TFE) 208 and a Touch Sensor on Encapsulation (TOE) 209 are sequentially laminated. Further, a PSA 210, a polarizer (POL) 211, a PSA 212, and a cover layer 213 are laminated on the TOE 209.

Figure 11:
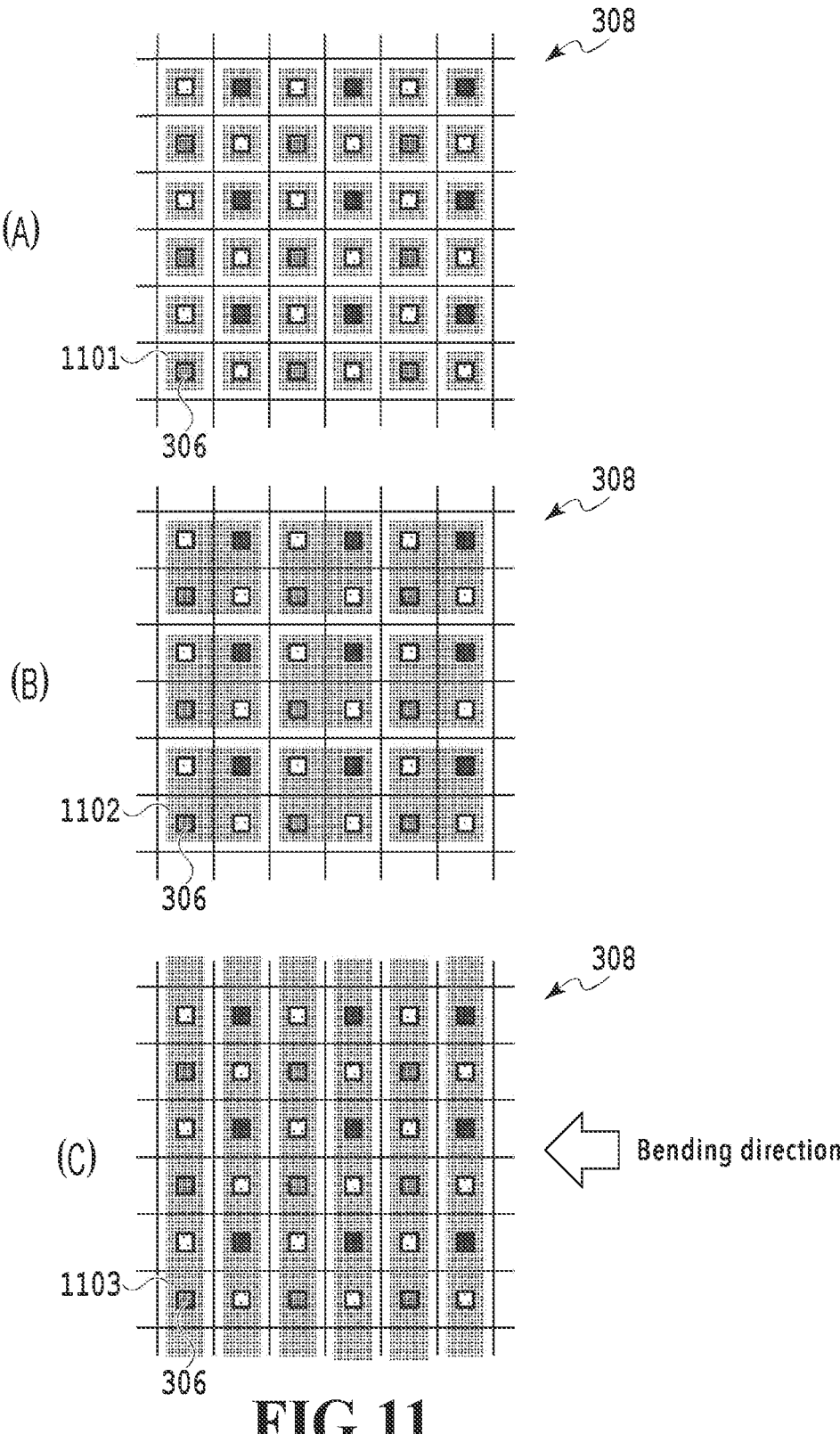
FIG. 11 is a diagram showing variations in the PSA pattern formed in the light emitting direction of a display element.

FIG. 2(B) shows a cross-sectional view of the flexible display 200 in a bent state. In this example, parts from the BF 203 to TFE 208 are shown for simple explanation. When the display panel is bent, the mechanical stress causes compressive strain on the inner concave surface and tensile strain on the outer convex surface. The magnitude of the strain is largest on the surface of the display panel, gradually decreases toward the inside of the display panel, and an imaginary surface with no compressive strain or tensile strain can be imagined near the center. Such a surface is called a neutral surface. In FIG. 2(B), 11 indicates a neutral plane. The PSA contained in the layered structure 200 is difficult to stretch and has a low ability to relieve the mechanical stress. In the present embodiment, by making the adhesive layer more flexible, a plurality of neutral surfaces is generated to reduce the mechanical stress.

Next, a structure of the flexible display according to the present embodiment will be described with reference to FIGS. 3 to 6. These figures assume a light extraction structure of a top emission type organic EL that emits light in the upward direction of the drawing.

Figure 3:
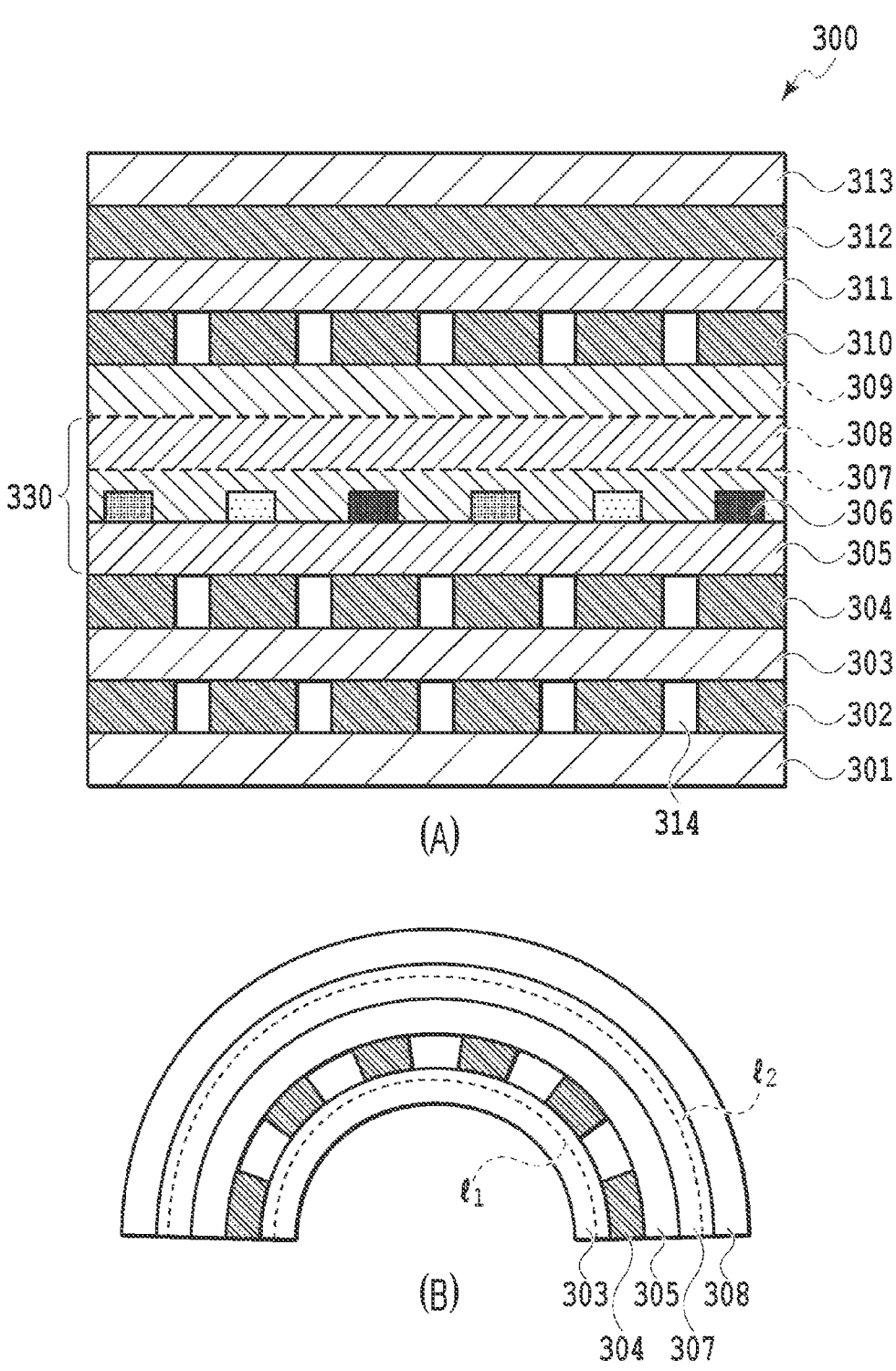
FIG. 3 is a diagram showing a cross-sectional structure of a flexible display according to an embodiment.

FIG. 3 is a diagram showing a cross-sectional structure of a flexible display according to the present embodiment. In the structure shown in FIG. 3(A), a PSA 302, a BF 303, and a PSA 304 are sequentially laminated on a substrate 301. The substrate 301 is made of PI or the like. The PSA 302 and 304 are films or tapes coated with a viscous substance, which is a non-reactive type and forms an adhesive. The pressure sensitive adhesive may include an adhesive material that forms an adhesive bond when pressure is applied thereof. It may include various natural and synthetic polymer materials such as epoxy pressure sensitive adhesives and silicone pressure sensitive adhesives. The BF 303 is interposed between two layers of the PSA. It is made of PI, polyethylene terephthalate (PET), etc.

Further, a TFT/PI 305, a light emitting layer 307 including an organic EL element 306, a TFE 308, and a TOE 309 are sequentially laminated on the PSA 304. The TFT/PI 305 is a composite layer composed of two layers in which a TFT for driving a display element 306 is formed on a polyimide substrate. The light emitting layer 307 constitute a plurality of pixels, and includes at least one display element for each pixel 306. The display element 306 is composed of a light emitting element such as an organic light emitting diode (OLED) that is driven by the TFT to form an image. In some embodiments, when the display element 306 is composed of the OLED, a cathode is formed above an organic layer and an anode may be formed below the organic layer. The upper cathode is a common electrode formed over the entire pixel in an active region of the display. The lower electrode (pixel electrode) may be formed for each pixel. There may be a bank layer between the OLEDs to determine the pixels. The bank layer is called a pixel defining layer (PDL). With such a configuration, the cathode and anode receive signals from the TFT and control the light emission of the organic layer.

The TFE 308 serves as a sufficient water vapor barrier in a thin film by alternately laminating an inorganic barrier layer and an organic barrier layer. For example, it is composed of an inorganic layer such as silicon (Si) and a resinous organic layer. The TFT/PI 305, the display element 306, and the TFE 308 constitute a display panel 330 for displaying an image.

The TOE 309 is a layer of a touch sensor. In some embodiments, the TOE 309 may be formed of a panel that senses changes in capacitance. Further, the TOE 309 may be a touch panel having a structure in which two transparent electrode layers each forming an electrode pattern superposed. Here, transparent electrodes in one layer extends in the X-axis direction and those in the other layer extends in the Y-axis direction to make a grid pattern of electrodes. In some embodiments, Indium Tin Oxide (ITO) can be used as the transparent electrode layer. Also, an insulating layer is provided between the two transparent electrode layers. In this way, the touch sensor senses a weak change in current generated when a surface of the flexible display is touched with a finger, and the touched position is obtained. When a user touches the panel surface with a finger, the capacitance between the electrodes arranged in the grid pattern changes at the same time, and the touched position is detected by measuring this. In some embodiments, the TOE 309 may be a resistive film, an ultrasonic, or an infrared type touch screen panel.

Further, the PSA 310, the POL 311, the PSA 312, and the cover layer 313 are laminated on the TOE 309. The POL 311 may include a polarization film and a phase difference film. The polarization film is configured to polarize light incident on the display panel 330 and light that is reflected from the display panel 330. The phase difference film may be laminated adjacent to the POL 311 to control the phases of the incident light and the reflected light. In some embodiments, the phase difference film may be formed adjacent to the display panel 330 rather than on the POL 311.

The POL 311 is imposed between the PSA 310 and the PSA 312 to attach the POL 311 to the display panel 330.

The cover layer 313 is formed to cover the flexible display 300. The cover layer 313 may include flexible material such as polymer.

In the flexible display 300, the display panel 330 corresponds to a display layer. The substrate 301 or the like as the first layer is provided on one surface of the display panel 330. Further, the POL 311 or the like as the second layer is provided on the other surface of the display panel 330.

The PSAs 302 and 304 as adhesive layers are provided between the display layer 330 and the substrate 301. Further, the PSA 310 and 313 as adhesive layers are provided between the display layer 330 and POL 311. Among the plurality of adhesive layers, the PSAs 302, 304 and 310 have elements separated in the in-plane direction by the gap 314. The gap may be occupied by air, or may be filled with a refractive index matching agent as described later. Since the PSA contained in the flexible display 300 is separated, the ability to relieve mechanical stress is increased.

It should be noted that the PSA 310 under the POL 311 is separated in the in-plane direction. If the separated adhesive layer is placed on the POL 311, the separated adhesive layer will be visible when external light enters, resulting in poor display quality. On the other hand, if a separated adhesive layer is placed under the POL 311, it is difficult to see because the polarizer absorbs the reflected light even if it is reflected by outside light. Therefore, the PSA 310 is provided between the surface of the TOE 309 and the surface of the POL 311.

FIG. 3(B) is a diagram schematically showing a cross-sectional view of a portion of the flexible display 300 in a bent state. In this example, the parts from the BF 303 to TFE 308 are shown for simple explanation. Also, l1 and l2 indicate neutral planes. In such a bent layer structure, the horizontally separated adhesive layer is more stretchable than the non-separated adhesive layer. Further, as shown in FIG. 3(B), a compressive force is applied to the inside of the BF 304, and a tensile force is applied to the outside to form a neutral surface l1. On the other hand, the compressive force is applied in the TFT/PI 305 and the tensile force is applied in the TFE 308, such that the neutral surface l2 can be formed. In this way, the mechanical stress is distributed inside and outside the PSA 304. Therefore, the ability to relieve mechanical stress is greater than that of the layered structure shown in FIG. 2(B).

Figure 4:
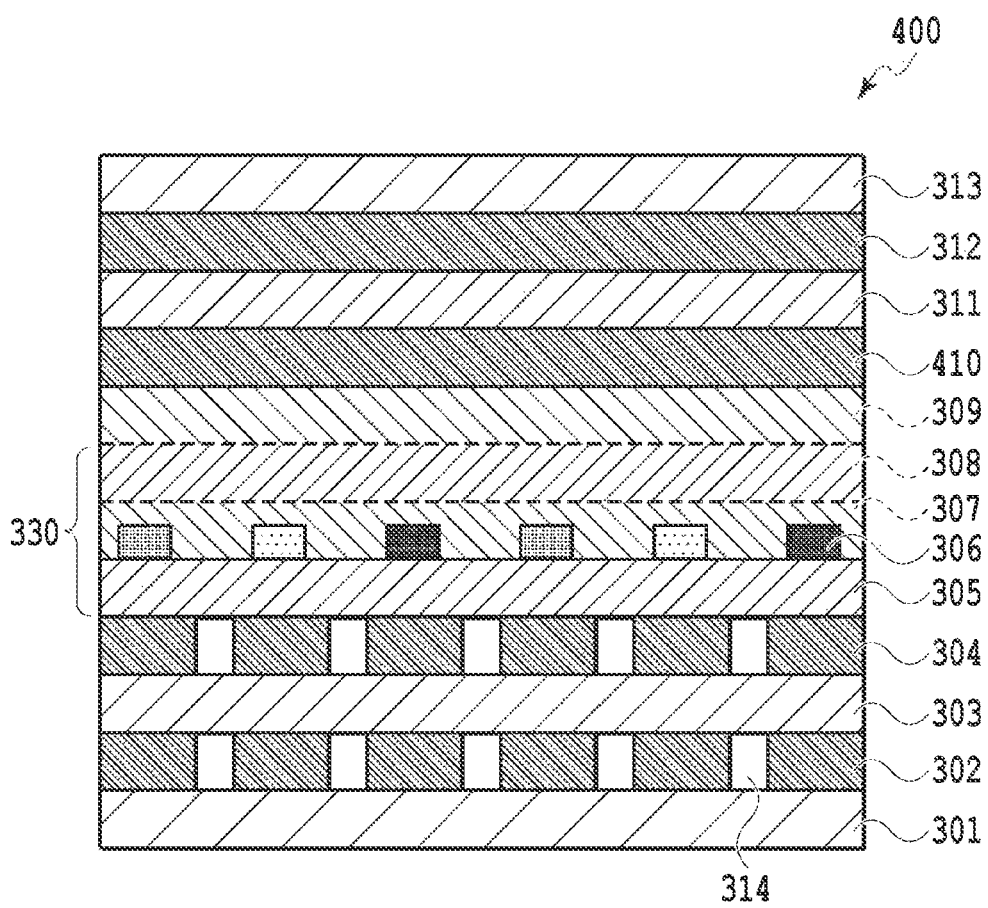
FIG. 4 is a diagram showing a cross-sectional structure of a flexible display according to an embodiment.

FIG. 4 shows a cross-sectional structure of a flexible display according to an embodiment. In the flexible display 400, the PSAs 302 and 304 located below the display layer 330 have in-plane separated elements. On the other hand, the PSAs 410 and 312 located above the display layer 330 are not separated. In this configuration, the PSAs 302 and 304 relieve the mechanical stress of the flexible display 400 by the separated elements.

Figure 5:
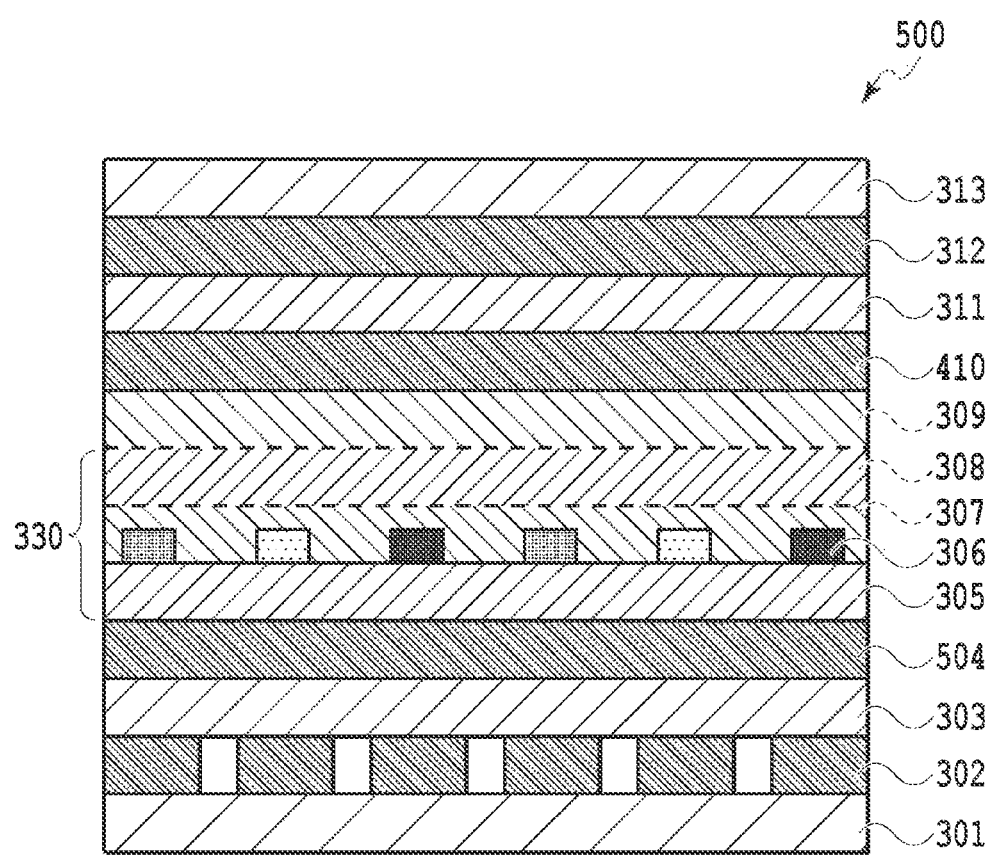
FIG. 5 is a diagram showing a cross-sectional structure of a flexible display according to an embodiment.

FIG. 5 shows a flexible display according to an embodiment. In the flexible display 500, the PSA 302 located below the display layer 330 has in-plane separated elements. On the other hand, the PSA 504 located below the display layer 330 and the PSAs 410 and 312 located above the display layer 330 are not separated. In this configuration, the PSA 302 relieves the mechanical stress of the flexible display 500 by the separated elements.

Figure 6:
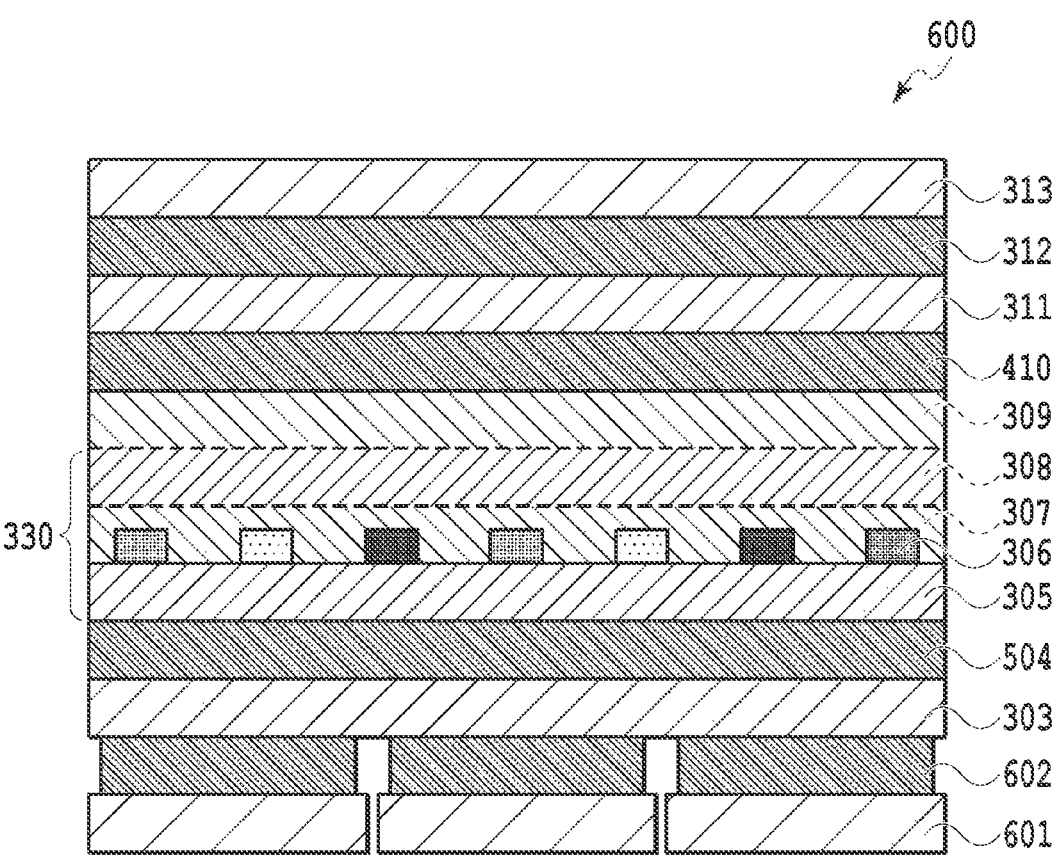
FIG. 6 is a diagram showing a cross-sectional structure of a flexible display according to an embodiment.

FIG. 6 shows a cross-sectional structure of a flexible display according to another embodiment. The supporting substrate is thicker than those in FIGS. 3 to 5 in order to hold the display. Therefore, if the supporting substrate cannot be bent as it is, it is divided. In the example shown in FIG. 6, the substrate 601 of the flexible display 600 is separated in the in-plane direction, unlike FIG. 5. Further, the PSA 602 laminated on the substrate 601 is separated into three elements. In this way, the widths of the divided elements may be matched for the substrate 601 and the PSA 602.

Next, a method for forming the separated PSA according to an embodiment will be described. In one embodiment, layers of the PSA can be formed by screen printing or inkjet printing. For example, a PSA pattern may be printed on a base layer such as the substrate or the back film by screen printing or inkjet printing.

In another embodiment shown below, an example of forming the PSA pattern on the substrate will be described.

Figure 7:
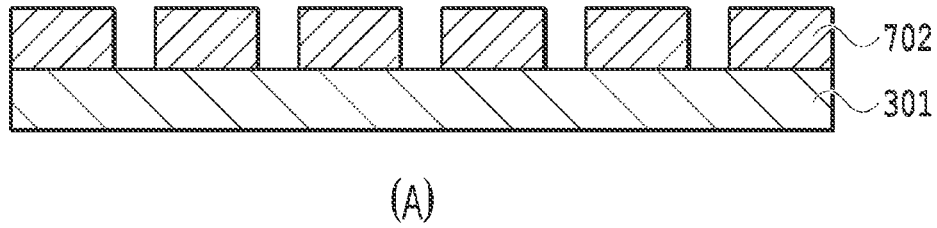
FIG. 7 is a diagram for explaining a method for forming a PSA according to an embodiment.
Figure 7:
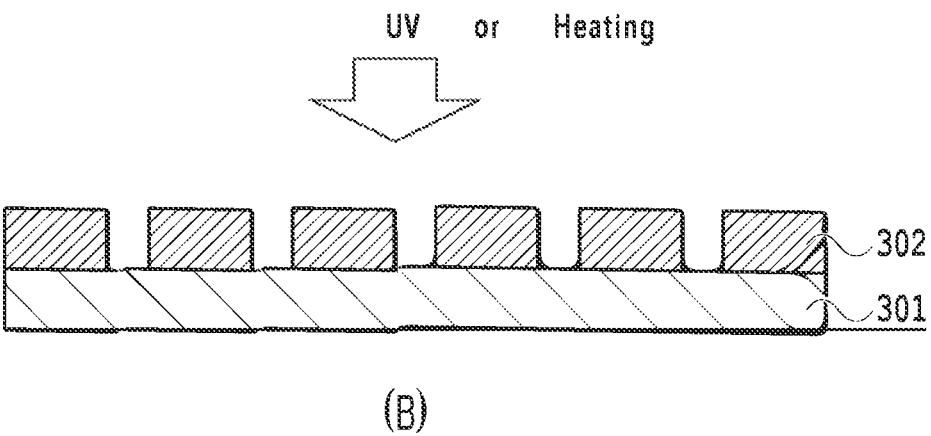

FIG. 7 is a diagram for explaining a method for forming PSA according to an embodiment. As shown in FIG. 7(A), a pattern of PSA precursor 702 is printed on the substrate 301 by screen printing or inkjet printing. The PSA precursor is a substance that is cured by irradiation with ultraviolet (UV) rays or heat to produce the PSA. Various adhesive precursor can be used as the PSA precursor. The precursor 702 is then cured by UV irradiation or heat as shown in FIG. 7(B) to form a pattern of the PSA 302. This method is effective when the viscosity of the precursor is low and the printing process can be used.

Figure 8:
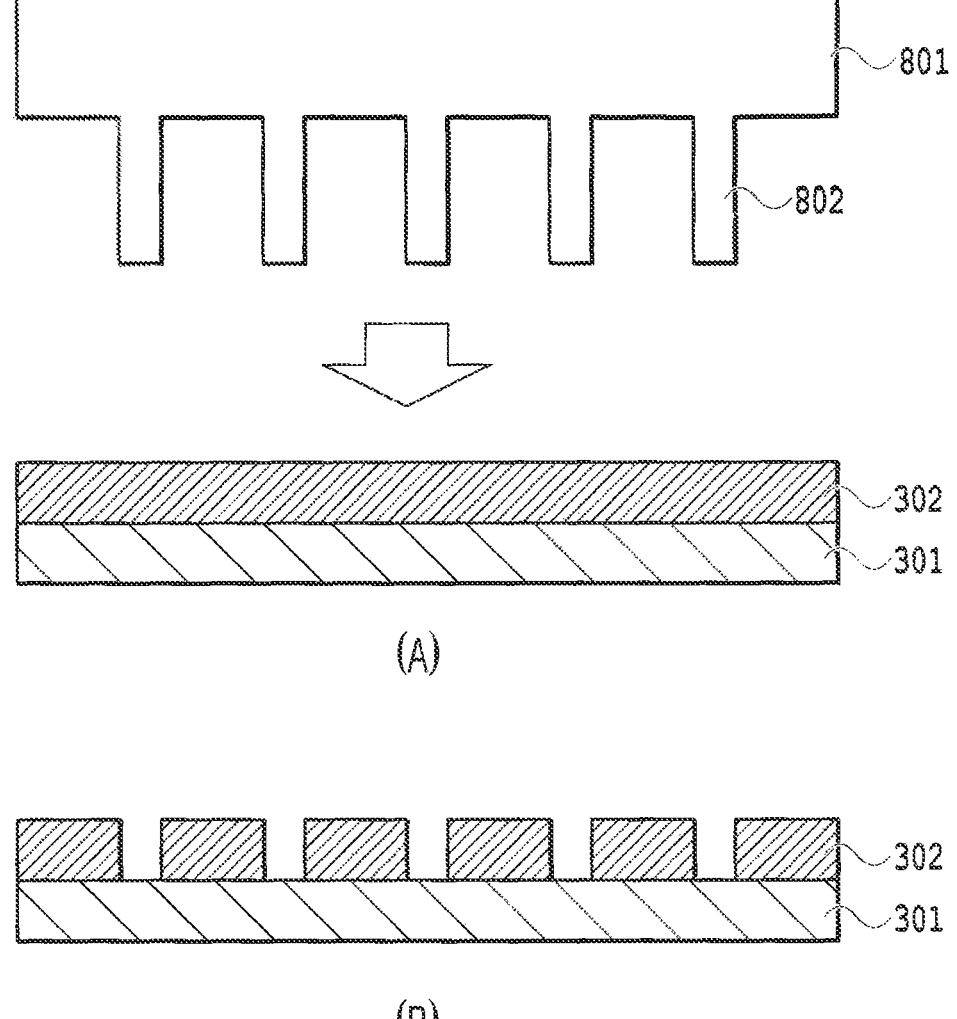
FIG. 8 is a diagram for explaining a method for forming a PSA according to an embodiment.

FIG. 8 is a diagram for explaining a method for forming a PSA according to an embodiment. First, as shown in FIG. 8(A), an unpatterned PSA 302 is laminated on the substrate 301. The PSA 302 is then separated using a mold 801 to form a pattern for the PSA 302 as shown in FIG. 8(B). In FIG. 8(A), the mold 801 has a plurality of protruding parts 802 that protrude downward at intervals corresponding to the PSA pattern. By pressing the protruding parts 802 against the PSA 302, the pattern of the PSA 302 is formed.

Figure 9:
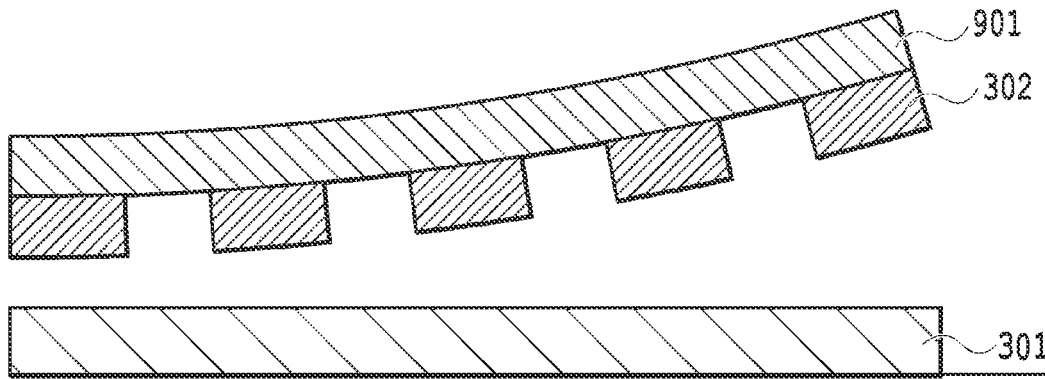
FIG. 9 is a diagram for explaining a method for forming a PSA according to an embodiment.

FIG. 9 is a diagram illustrating a method for forming a PSA according to an embodiment. First, a temporary substrate 901 is prepared, and a pattern of the PSA 302 is formed on the temporary substrate 901 by screen printing or inkjet printing. Then, as shown in FIG. 9, the pattern of the PSA 302 is transferred onto the substrate 301. In one embodiment, the PSA precursor pattern is formed on the temporary substrate 901 and the PSA precursor pattern is transferred onto the substrate 301. The precursor pattern is then cured by irradiating the precursor pattern with UV or heating the precursor to form the PSA 302 pattern.

In some embodiments, the thickness of each adhesive layer may be from about 5 micrometers (μm) to 300 μm, preferably from 15 μm to 100 μm. The length of the adhesive layer may be 5 μm to 10 millimeters (mm), preferably 30 μm to 200 μm. The distance between the separated adhesive layers may be 10 μm to 10 mm, preferably 30 μm to 1 mm.

The overall manufacturing process of the display module using the flexible display according to the present embodiment is the same as the manufacturing process of a normal display module.

Second Embodiment

Figure 12:
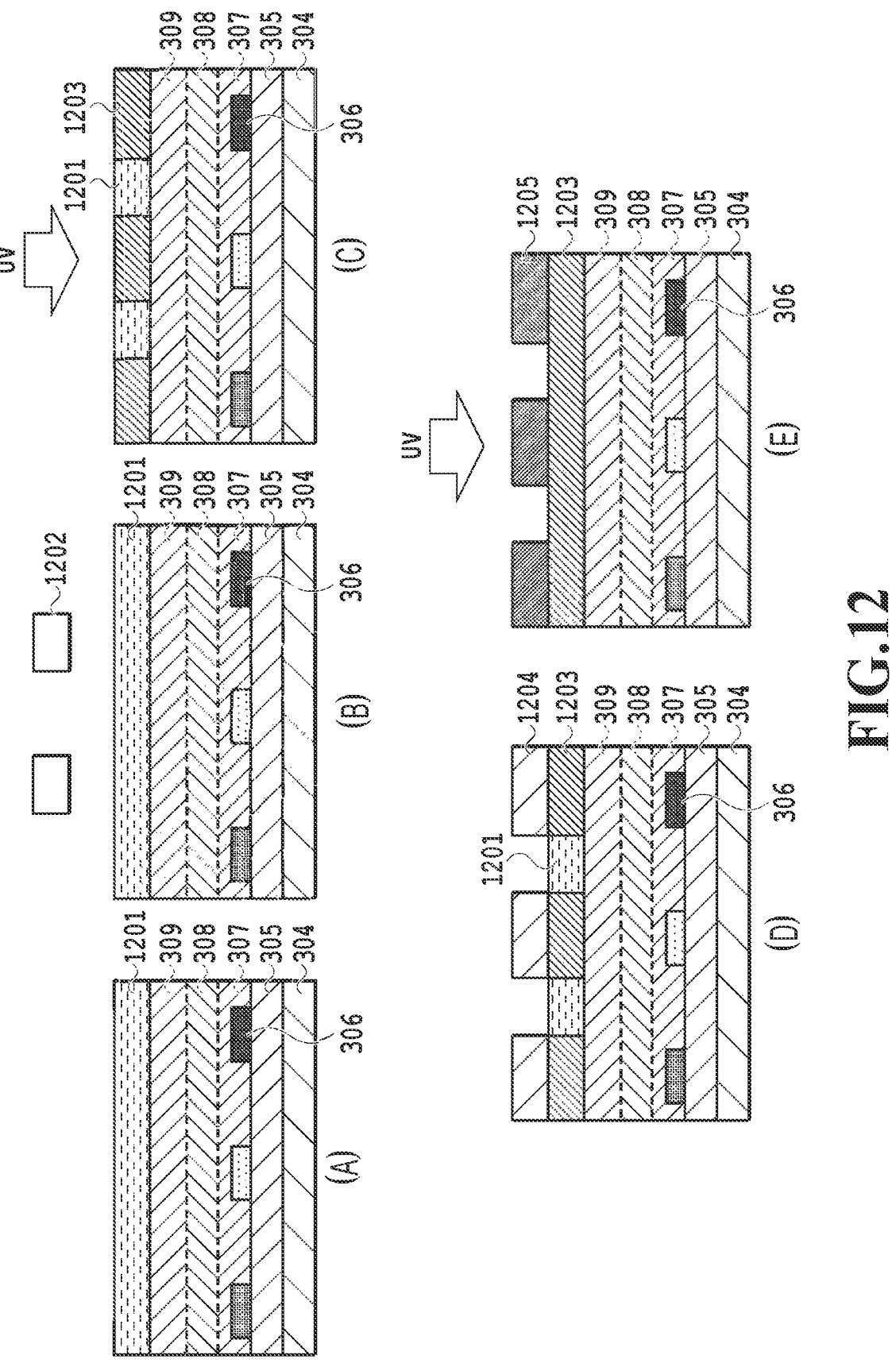
FIG. 12 is a diagram for explaining a method of forming a PSA in the light emitting direction of a display element according to an embodiment.

Next, with reference to FIGS. 10 to 12, a flexible display in which the PSA is formed in the light emitting direction of the display element and a method for manufacturing the flexible display will be described.

Figure 10:
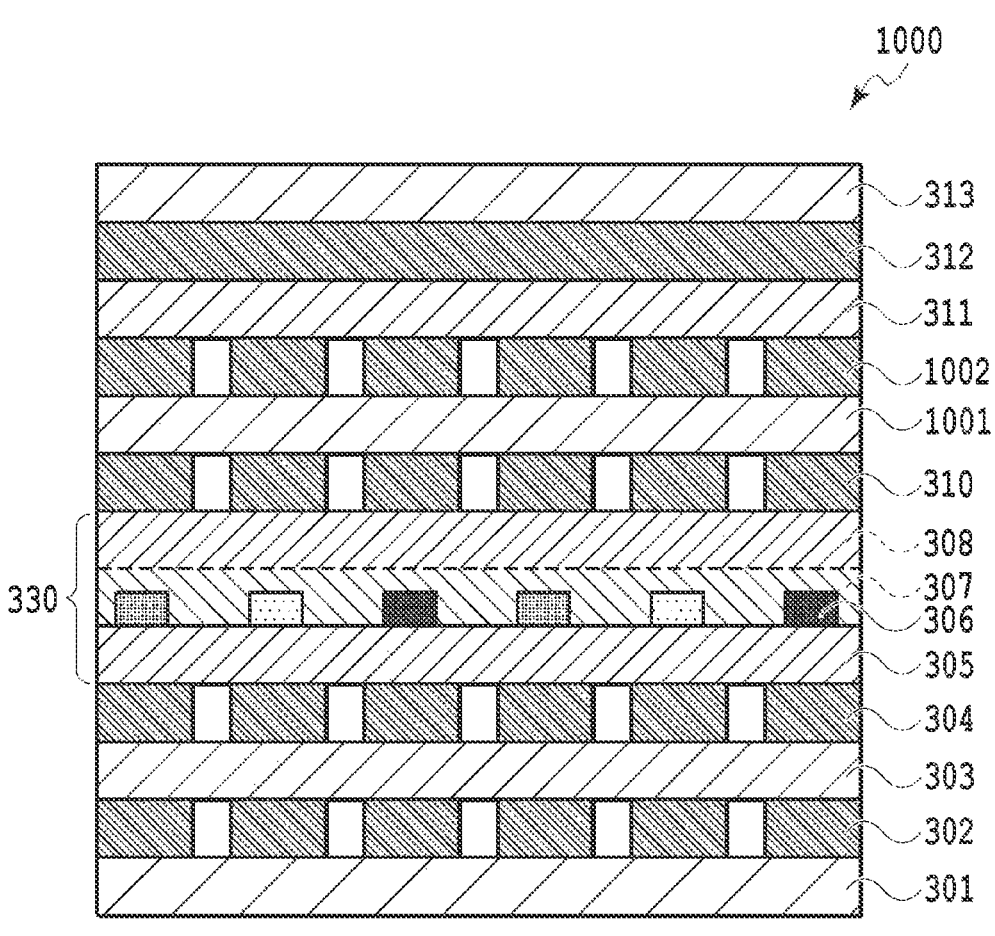
FIG. 10 is a diagram showing a cross-sectional structure of a flexible display according to an embodiment.

FIG. 10 shows the layer structure of the flexible display according to the present embodiment. In the flexible display 1000, PSAs 302 and 304 located below the display layer 330 have in-plane separated elements as in FIG. 3. On the other hand, the layers above the TFE 308 is different from FIG. 3. The PSA 310, a touch panel (TP) 1001, a PSA 1002, the POL 311, the PSA 312, and the cover layer 313 are laminated on the TFE 308. The PSA 310 and 1002 located above the display layer 330 are separated in the in-plane direction. The TP 1001 located between the PSA 310 and 1002 may be configured as a capacitive panel.

In such a configuration, the PSAs 302, 304, 310 and 1002 relieve the mechanical stress of the flexible display 1000.

As shown in FIGS. 4 to 6, when a PSA pattern is formed on the side opposite to the light emitting direction of the display layer 330 (lower side of the drawing), it is not necessary for the plurality of separated elements to be separated so as to cover each display element. Therefore, the lower PSA pattern can be formed without precisely aligning the display element. On the other hand, as shown in FIGS. 3 and 10, when the PSA is formed in the light emitting direction of the display layer 330 (upper side of the drawing), the PSA is separated such that its elements are aligned so as to cover each display element. This is because if the PSA pattern is not aligned so as to correspond to the display elements, the user can see the PSA pattern, causing a sense of discomfort.

FIG. 11 shows variations of the PSA pattern formed in the light extraction direction of the display element. As mentioned above, the PSA pattern is separated such that each of the elements is separated so as to cover at least one display element. In FIG. 11, the PSA is formed on the display element 306 via the TFE 308.

In FIG. 11(A), on top of the TFE 308, one PSA element 1101 is formed to cover one display element 306. In FIG. 11(B), on top of the TFE 308, one PSA element 1102 is formed to cover the four display elements 306. As shown in FIG. 11(A), the PSA pattern shown in FIG. 11(B) is easy to manufacture because the number of separated elements is smaller than that of the fine pattern matched to each display element.

In FIG. 11(C), the element 1103 of the PSA formed on the TFE 308 has a gap extending in the direction perpendicular to the bending direction of the flexible display indicated by an arrow. The PSA is separated so as to be discontinuous in the bending direction of the flexible display. Therefore, the mechanical stress when the flexible display is bent or wound in the direction of the arrow is relieved.

As mentioned above, when the PSA is formed in the light emitting direction of the display element, it is necessary to form a pattern such that the separated elements of PSA are accurately aligned, unlike the case where it is formed in the opposite direction. In this case, photolithography can be used with respect to a method for producing a precisely patterned PSA. Next, using an example of forming the PSA pattern on the TOE 309 layer structure of FIG. 3, an example of a method of forming the PSA pattern in the light emitting direction of the display element will be described.

As shown in FIG. 12(A), photosensitive water-repellent material 1201 is laminated on top of the TOE 309. Photosensitive water-repellent material is a substance that can be laminated on various substrates. Further, the photosensitive water-repellent material is a material capable of converting the film surface of the exposed portion from water-repellent to hydrophilic by irradiating a desired position on the film with UV. As the photosensitive water-repellent material, a polymer having at least one group selected from a group of an acetal bond or a group containing silicon, and a composition containing an acid generator may be used. For example, photo-induced surface control (PISC) material may be used.

Next, as shown in FIG. 12(B), a mask 1202 is laminated on the photosensitive water-repellent material 1201 to form a mask pattern such that the mask 1202 is arranged at a position that is a gap between the elements of the PSA.

Then, as shown in FIG. 12(C), UV is irradiated from the upper side of the drawing or heat is applied to activate the photosensitive water-repellent material 1201. As a result, the element 1203 in which the activated portion is hydrophilized is obtained. Then, as shown in FIG. 12(D), the precursor 1204 of PSA 1204 is laminated on the element 1203. Finally, UV irradiation or heat from the upper side of the drawing activates the precursor 1204 and transforms it into a PSA 1205. Thus, the method using photolithography as described above has an advantage that the pixels can be easily matched with the patterned PSA.

According to the method described above, it is possible to prevent the user from recognizing the PSA pattern in the flexible display.

The overall manufacturing process of the display module using the flexible display according to the present embodiment is the same as the manufacturing process of a normal display module.

Third Embodiment

Next, with reference to FIGS. 13 to 18, an embodiment in which a refractive index matching agent is provided in the gap between adjacent PSAs will be described.

Figure 13:
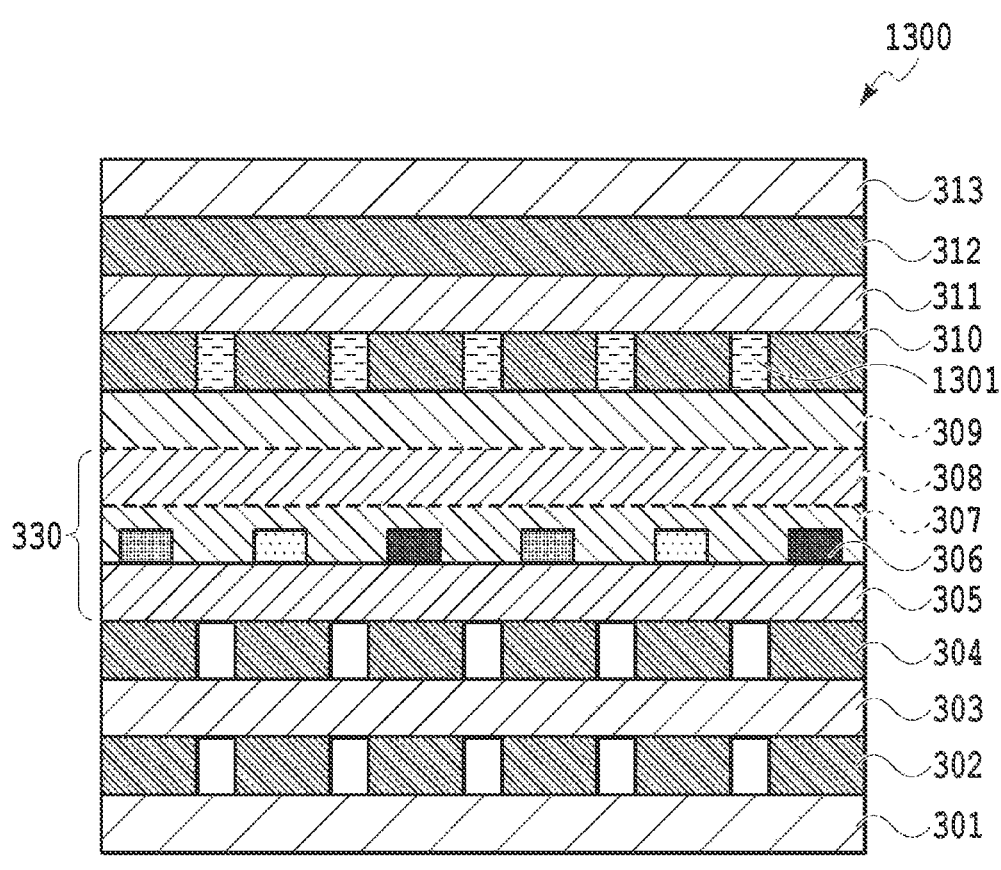
FIG. 13 is a diagram showing a cross-sectional structure of a flexible display according to an embodiment.

FIG. 13 is a cross-sectional view showing a structure of a portion of the flexible display 100 according to an embodiment of the present disclosure. The structure shown in FIG. 13 is similar to that in FIG. 3. However, the gaps between adjacent elements are filled with the refractive index matching oil 1301. The refractive index matching oil 1301 is configured to match the refractive index with the PSA 310. The refractive index matching oil 1301 is an example of a refractive index matching agent. For example, a silicon-based or paraffin-based refractive index matching agent can be used as the refractive index matching agent. Further, various forms such as a refractive index matching gel, a refractive index matching oil, a refractive index matching film, or a liquid type matching agent may be used as the refractive index matching agent. In some embodiments, the elastic modulus (Young's modulus) of the refractive index matching agent may be smaller than that of the pressure-sensitive adhesive.

Figure 14:
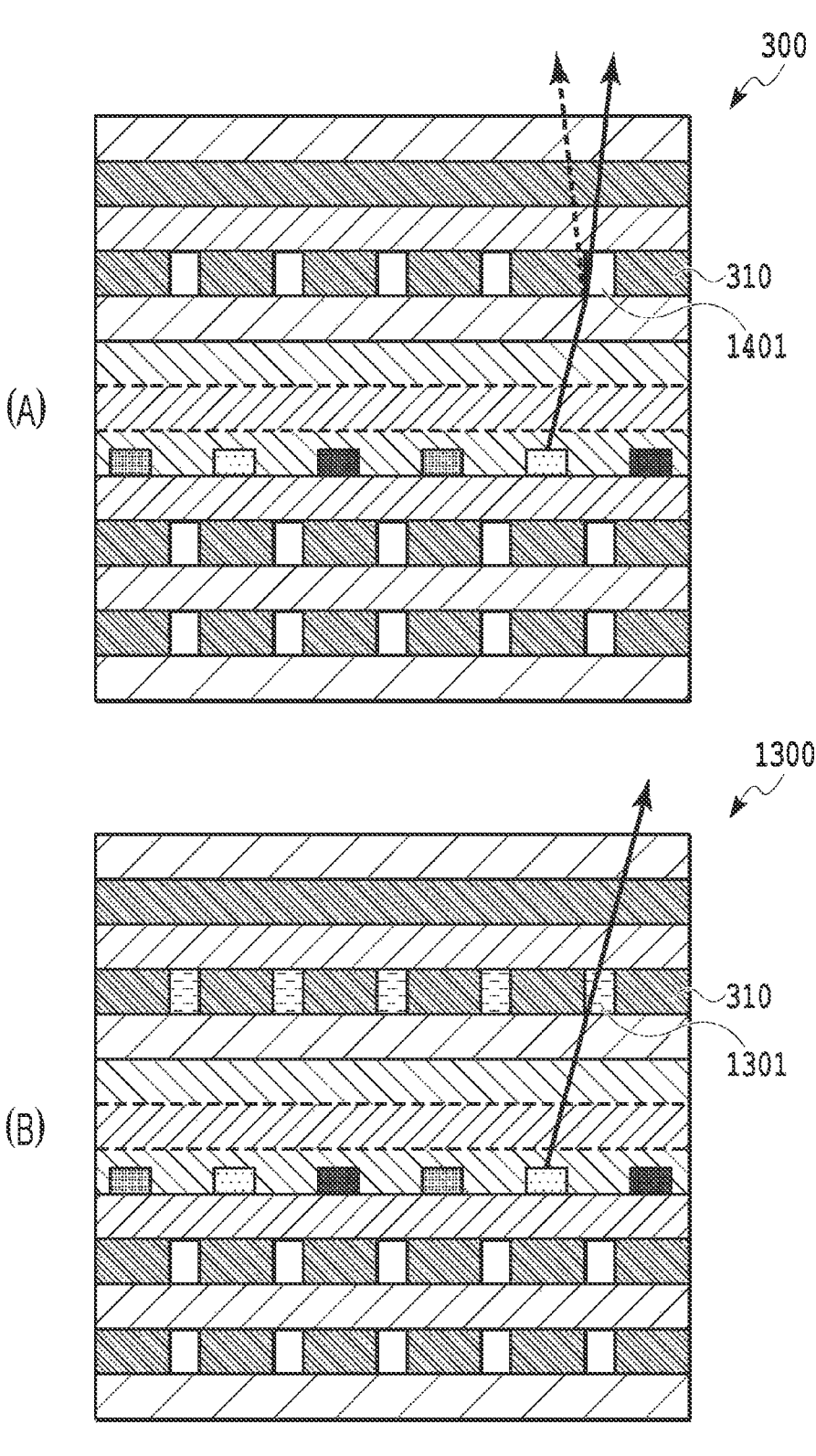
FIG. 14 is a diagram illustrating an operation of the embodiment shown in FIG. 13.

FIG. 14 is a diagram illustrating the operation of the flexible display according to the embodiment shown in FIG. 13. FIG. 14(A) shows an example in which the display element 306 emits light in the flexible display 300 shown in FIG. 3. The PSA 310 of the flexible display 300 contains air 1401 between the separated elements. This air 1401 has a different refractive index from the PSA 310. When light is emitted from the display element 306 as shown by a solid arrow, the light is reflected at the interface between the air 1401 and the PSA 310, and the reflected light is generated as shown by a broken line arrow. This reflected light results in deterioration of the quality of the displayed image.

FIG. 14(B) shows an example in which the display element 306 emits light in the flexible display 1300 shown in FIG. 3. The PSA 310 of the flexible display 1300 contains a refractive index matching oil 1301 between the separated elements. When light is emitted from the display element 306 as shown by the solid arrow, reflection of light at the interface between air 1401 and PSA 310 is prevented. In this way, it is possible to suppress deterioration of the quality of the displayed image.

Figure 15:
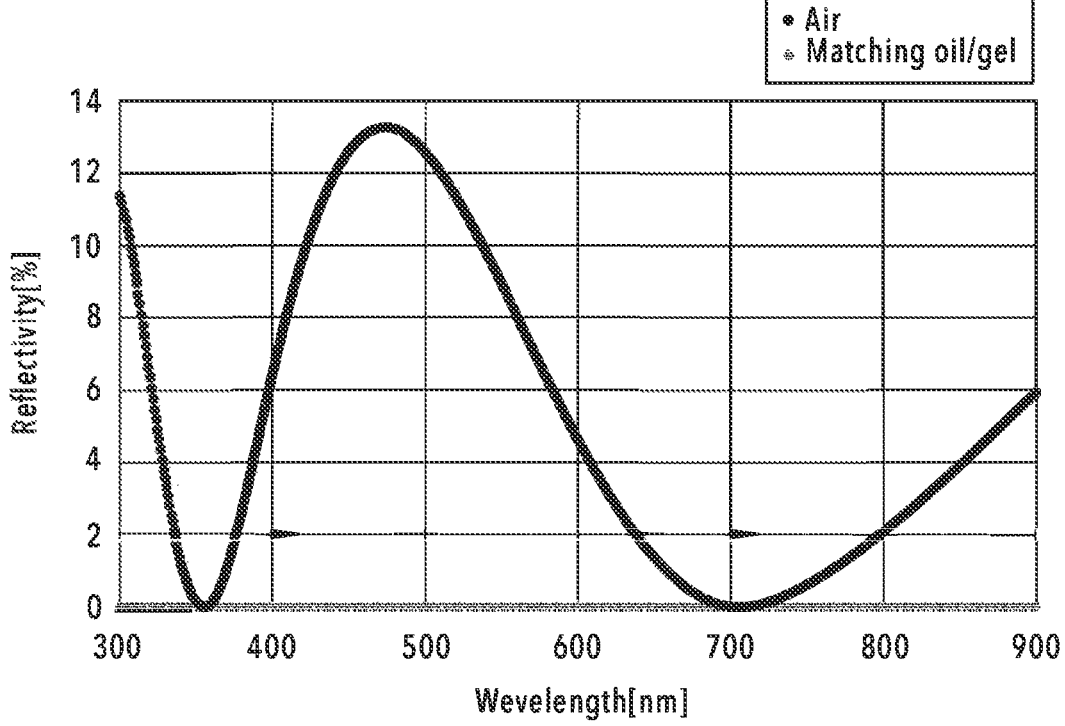
FIG. 15 is a graph simulating the relationship between emission wavelength of a display element and the reflection of light in one embodiment.

FIG. 15 is a graph simulating the relationship between the emission wavelength of the display element and the reflection of light in the embodiment which uses the refractive index matching agent. In FIG. 15, the horizontal axis represents emission wavelength (nanometer (nm)) and the vertical axis represents reflectivity (%). In this simulation, the refractive index of refraction of the PSA is 1.41, the refractive index of refraction matching gel or refraction matching oil is 1.42, and the light reflection angle is 30 degrees. The black curve shows the reflectivity in a flexible display where air is present in the PSA gap. The gray line indicates the reflectivity in a flexible display using a refractive index matching gel or a refractive index matching oil. When air is present in the PSA gap, the reflectivity changes depending on the wavelength, and the reflected light may exceed 13% between 400 nm and 500 nm. On the other hand, it can be seen that the flexible display using the refractive index matching gel or the refractive index matching oil has a constant reflectivity of 0% and can suppress the reflected light.

Figure 16:
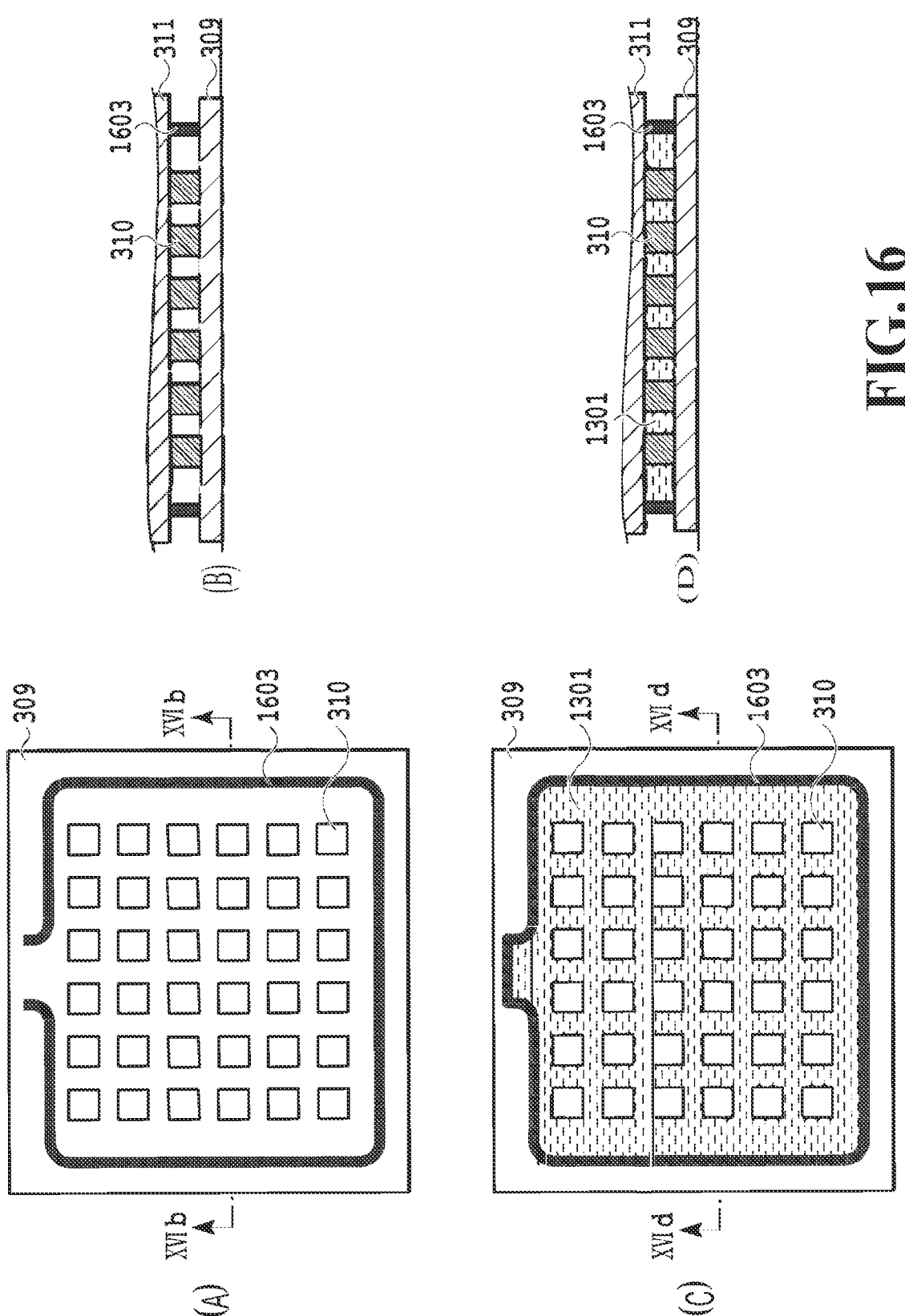
FIG. 16 is a diagram showing an example of a method of filling gaps of a PSA with refractive index matching oil.

In some embodiments, the refractive index matching oil may be filled by a vacuum-pressure impregnation method. FIG. 16 is a diagram showing an example of a method of filling the gaps of PSA with refractive index matching oil by the vacuum-pressure impregnation method. FIGS. 16(A) and 16(B) are a top sectional view and a side sectional view of the PSA 310 of the flexible display 300 shown in FIG. 3. As shown in FIG. 16(A), a pattern of a PSA 1602 is formed on the TOE 309 in the manufacturing process of the flexible display 300. Further, a dam 1603 having an opening at the upper part of the drawing is formed on the TOE 309 so as to surround the PSA 310. The dam 1603 may be formed of an adhesive, resin, or the like. As shown in FIG. 16(B), the dam 1603 is formed to have the same thickness as the PSA 310.

FIGS. 16(C) and 16(D) are a top view and a side sectional view of a structure filled with refractive index matching oil. In a vacuum state, the opening of the dam 1603 of the laminated body of the flexible display 300 is dipped in the refractive index matching oil. Next, the laminated composite is exposed to the atmosphere while being immersed in the refractive index matching oil. Since the inside of the dam 1603 is a vacuum, the refractive index matching oil automatically permeates the inside. When the index-matching oil has spread to the entire area surrounded by the dam 1603, the opening is sealed (i.e. the dam 1603 is completely sealed) as shown in FIG. 16(C).

Thus, the refractive index matching oil 1301 is impregnated using the vacuum state, and the PSA 310 is completely sealed by the dam 1603.

Figure 17:
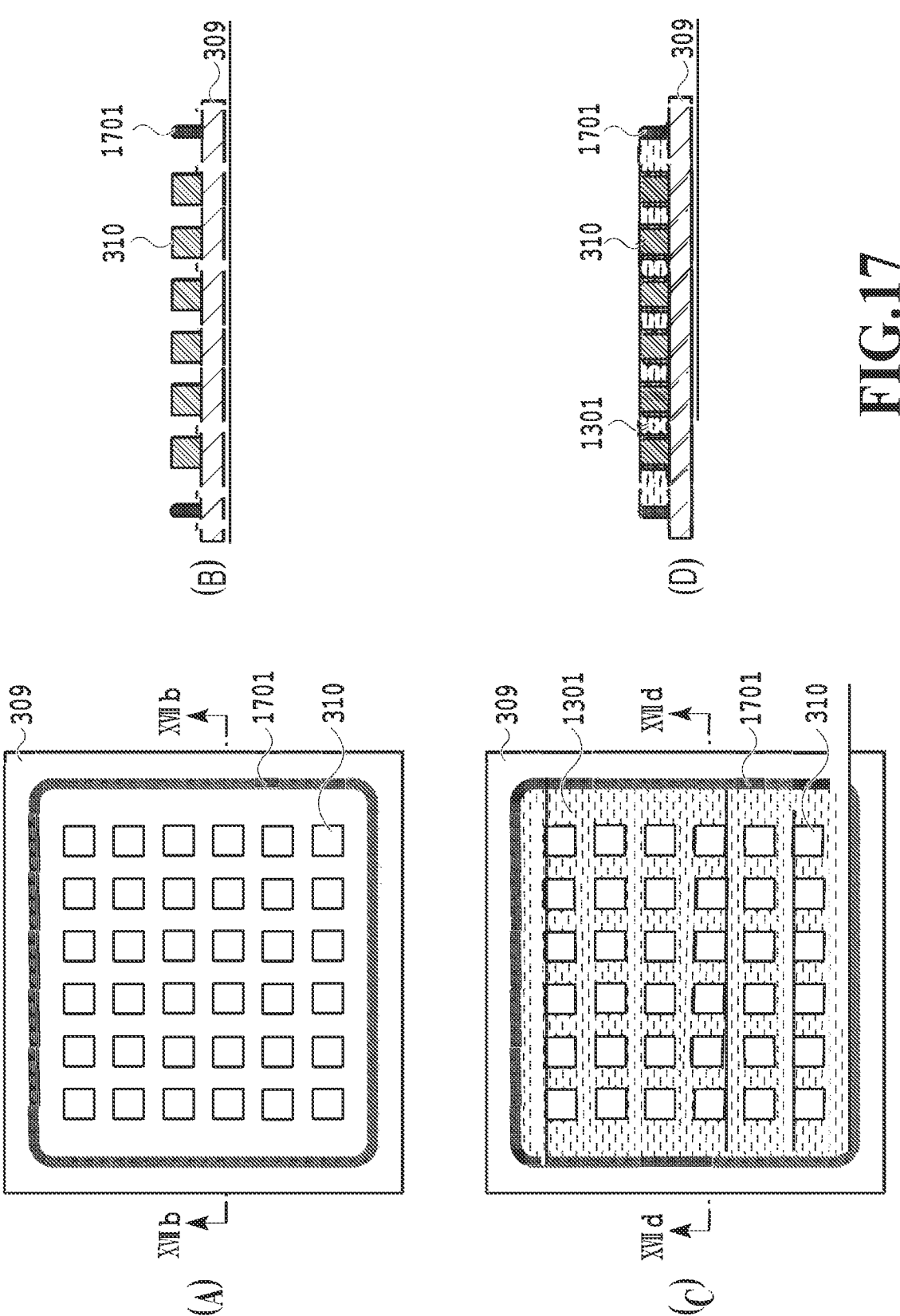
FIG. 17 is a diagram showing an example of a method of filling gaps of a PSA with refractive index matching oil.

Since the refractive index matching oil is liquid, a dam surrounding the PSA may be created, and the refractive index matching oil may be dropped into the dam in the process of forming the PSA. FIG. 17 shows an example of a method of filling the gaps of PSA with refractive index matching oil. FIGS. 17(A) and 17(B) are a top view and a side sectional view of a structure in which a pattern of the PSA 310 is formed on the TOE 309. In FIG. 17(A), a dam 1701 is formed on the TOE 309 so as to completely surround the PSA 310.

FIGS. 17(C) and 17(D) are a top view and a side sectional view of a structure filled with refractive index matching oil. In the embodiment, the refractive index matching oil 1301 is dropped and filled between elements of the PSA 310.

Figure 18:
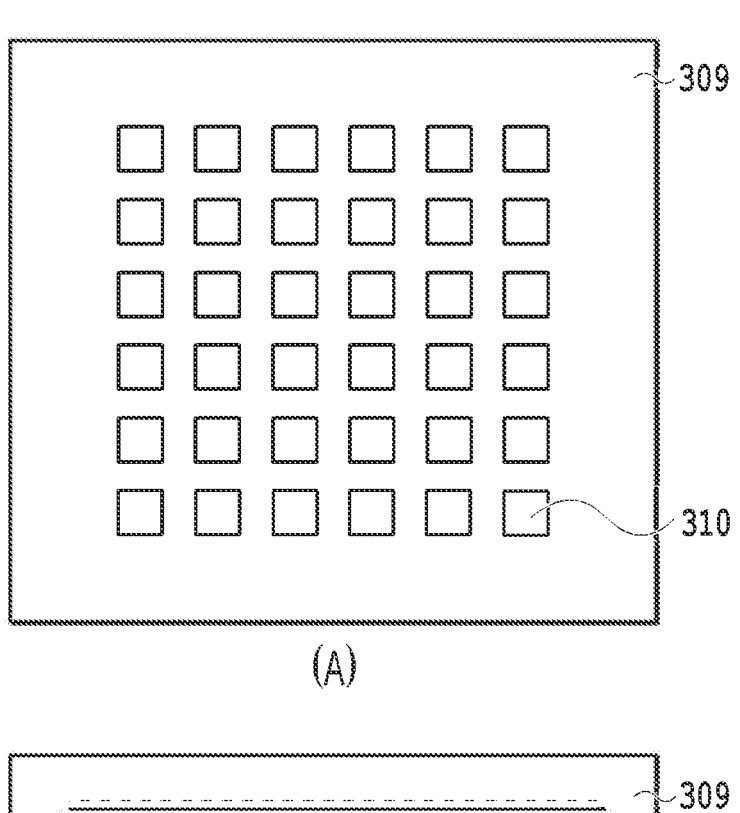
FIG. 18 is a diagram showing an example of a method of filling gaps of a PSA with a refractive index matching gel.
Figure 18:
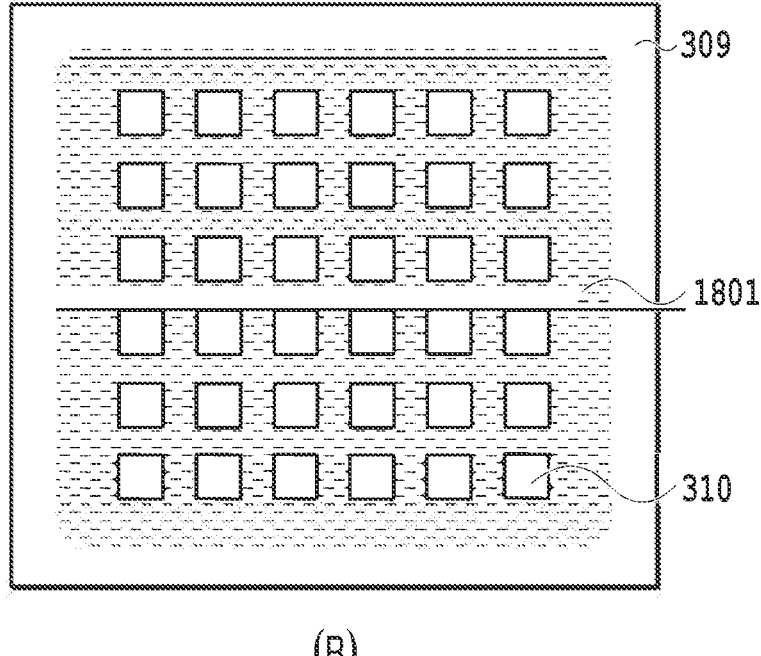

Since the refractive index matching gel is viscous, inkjet printing can be used when filling the gaps in the PSA with it. FIG. 18 shows an example of a method of filling the gaps of the PSA with the refractive index matching gel. FIG. 18(A) is a top view of a structure in which a pattern of the PSA 310 is formed on the TOE 309. In the case of the refractive index matching gel, it is not necessary to form a dam structure because it is viscous. Therefore, as shown in FIG. 18(B), the refractive index matching gel 1801 can be printed by inkjet printing over the entire pattern of the PSA 310 to fill the gaps of the PSA with the refractive index matching gel.

The present disclosure can be applied to flexible displays such as foldable displays and rollable displays. The rollable displays can provide both large displays and portability in mobile displays.

The described descriptions are merely specific implementation manners of the present disclosure, but are not intended to limit the protection scope of the present disclosure. Any variation or replacement readily figured out by a person skilled in the art within the technical scope disclosed shall fall within the protection scope of the present disclosure. Therefore, the protection scope of the present disclosure shall be subject to the protection scope of the claims.

What is claimed is:

1. A flexible display, comprising:
   a display layer comprising a first surface, a second surface, and a plurality of light emitting elements;
   a first layer disposed on the first surface;
   a second layer disposed on the second surface; and
   an adhesive layer disposed between the display layer and the first layer or between the display layer and the second layer,
   wherein the adhesive layer comprises first elements separated in an in-plane direction,
   wherein the first layer comprises a substrate having second elements separated in the in-plane direction, and
   wherein a number of the first elements corresponds to the second elements.

2. The flexible display of claim 1, wherein when the adhesive layer is disposed in a light emitting direction of the light emitting elements, each of the first elements is configured to cover at least one display element.

3. The flexible display of claim 1, wherein the adhesive layer is separated such as to be discontinuous in a bending direction of the flexible display.

4. The flexible display of claim 1, wherein the adhesive layer is disposed with a refractive index matching agent in a gap between adjacent separated elements.

5. The flexible display of claim 4, wherein a first elastic modulus of the refractive index matching agent is smaller than a second elastic modulus of an adhesive of the adhesive layer.

6. The flexible display of claim 1, wherein the second layer includes a polarizer, and wherein the adhesive layer is disposed between the display layer and the polarizer.

7. A method comprising:

forming a first adhesive layer on a first layer, wherein the first adhesive layer comprises first elements separated in an in-plane direction, and wherein the first layer comprises a substrate having third elements separated in the in-plane direction, and wherein a number of the first elements corresponds to the third elements;

forming a display layer having a plurality of light emitting elements;

forming a second adhesive layer on the display layer, wherein the second adhesive layer comprises second elements separated in the in-plane direction; and forming a second layer on the second adhesive layer.

8. The method of claim 7, wherein each of the second elements is configured to cover at least one display element when the second adhesive is formed in a light emitting direction of the light emitting elements.

9. The method of claim 7, further comprising separating the first adhesive layer and/or the second adhesive layer such as to be discontinuous in a bending direction of a display device.

10. The method of claim 7, wherein forming the first adhesive layer and/or forming the second adhesive layer includes providing a refractive index matching agent in a gap between adjacent separated elements by screen printing or inkjet printing.

11. The method of claim 10, wherein a first elastic modulus of the refractive index matching agent is smaller than a second elastic modulus of an adhesive of the first adhesive layer and/or the second adhesive layer.

12. The method of claim 10, wherein providing the refractive index matching agent comprises:

forming a dam surrounding the first adhesive layer and/or the second adhesive layer; and filling inside of the dam with the refractive index matching agent.

13. The method of claim 7, further comprising forming the first adhesive layer and/or forming the second adhesive layer by screen printing or inkjet printing.

14. The method of claim 7, wherein forming the first adhesive layer and/or forming the second adhesive layer comprises:

forming an adhesive precursor by screen printing or inkjet printing; and irradiating the adhesive precursor with ultraviolet (UV) or heating the precursor.

15. The method of claim 7, wherein forming the first adhesive layer and/or forming the second adhesive layer comprises:

forming the first adhesive layer and/or the second adhesive layer which is continuous in the in-plane direction on the display layer; and separating the first adhesive layer and/or the second adhesive layer into the first elements or the second elements, respectively.

16. The method of claim 7, wherein forming the first adhesive layer comprises:

forming a pattern of the first adhesive layer on a temporary substrate; and transferring the pattern onto the first layer.

17. The method of claim 7, wherein forming the second adhesive layer comprises:

forming a pattern of the second adhesive layer on a temporary substrate; and transferring the pattern onto the display layer.

18. The method of claim 7, wherein forming the second adhesive layer comprises:

laminating a photosensitive water-repellent material on the display layer;

laminating a mask on the photosensitive water-repellent material to form a mask pattern;

changing the photosensitive water-repellent material into a hydrophilic substance by irradiating the photosensitive water-repellent material with ultraviolet (UV) or heating the photosensitive water-repellent material; and forming the second adhesive layer on the hydrophilic substance.

19. A flexible display, comprising:

a display layer comprising a first surface, a second surface, and a plurality of light emitting elements;

a first layer disposed on the first surface;

a second layer disposed on the second surface; and a first adhesive layer disposed between the display layer and the first layer;

a second adhesive layer disposed between the display layer and the second layer, wherein the second adhesive layer comprises first elements separated in an in-plane direction, wherein the first layer comprises a substrate having second elements separated in the in-plane direction, and wherein a number of the first elements corresponds to the second elements.

20. The flexible display of claim 19, wherein the first adhesive layer or the second adhesive layer is separated such as to be discontinuous in a bending direction of the flexible display.

\* \* \* \* \*